(12) United States Patent
Rozbicki et al.

(10) Patent No.: US 10,627,691 B2
(45) Date of Patent: Apr. 21, 2020

(54) TEMPERABLE ELECTROCHROMIC DEVICES

(71) Applicant: View, Inc., Milpitas, CA (US)

(72) Inventors: Robert T. Rozbicki, Germantown, TN (US); Anshu A. Pradhan, Collierville, TN (US)

(73) Assignee: View, Inc., Milpitas, CA (US)

( * ) Notice: Subject to any disclaimer, the term of this patent is extended or adjusted under 35 U.S.C. 154(b) by 354 days.

(21) Appl. No.: 15/633,597

(22) Filed: Jun. 26, 2017

(65) Prior Publication Data

US 2017/0307951 A1  Oct. 26, 2017

Related U.S. Application Data

(63) Continuation of application No. 14/137,750, filed on Dec. 20, 2013, now Pat. No. 9,723,723, which is a
(Continued)

(51) Int. Cl.
*G02F 1/153* (2006.01)
*C23C 14/58* (2006.01)
(Continued)

(52) U.S. Cl.
CPC .......... *G02F 1/1533* (2013.01); *C03B 27/012* (2013.01); *C03C 17/3417* (2013.01);
(Continued)

(58) Field of Classification Search
None
See application file for complete search history.

(56) References Cited

U.S. PATENT DOCUMENTS 5,133,594 A   7/1992  Haas et al.
5,800,933 A * 9/1998  Hartig .............. B32B 17/10174
                                              428/622
(Continued)

FOREIGN PATENT DOCUMENTS

JP        56106223 A  *  8/1981
WO    WO2011/010067 A2    1/2011

OTHER PUBLICATIONS

U.S. Office Action dated Nov. 7, 2016 in U.S. Appl. No. 14/137,750.
(Continued)

*Primary Examiner* — John J Brayton
(74) *Attorney, Agent, or Firm* — Weaver Austin Villeneuve & Sampson LLP; Brian D. Griedel

(57) ABSTRACT

This disclosure provides systems, methods, and apparatus for tempering or chemically strengthening glass substrates having electrochromic devices fabricated thereon. In one aspect, an electrochromic device is fabricated on a glass substrate. The glass substrate is then tempered or chemically strengthened. The disclosed methods may reduce or prevent potential issues that the electrochromic device may experience during the tempering or the chemical strengthening processes, including the loss of charge carrying ions from the device, redistribution of charge carrying ions in the device, modification of the morphology of materials included in the device, modification of the oxidation state of materials included in the device, and the formation of an interfacial region between the electrochromic layer and the counter electrode layer of the device that impacts the performance of the device.

21 Claims, 9 Drawing Sheets

Related U.S. Application Data continuation of application No. PCT/US2012/043385, filed on Jun. 20, 2012, and a continuation-in-part of application No. 12/645,111, filed on Dec. 22, 2009, now Pat. No. 9,664,974.

(60) Provisional application No. 61/499,618, filed on Jun. 21, 2011, provisional application No. 61/165,484, filed on Mar. 31, 2009.

(51) Int. Cl.

| | |
|---|---|
| G02F 1/1523 | (2019.01) |
| C03B 27/012 | (2006.01) |
| G02F 1/155 | (2006.01) |
| H05K 3/10 | (2006.01) |
| C03C 17/34 | (2006.01) |
| C23C 14/08 | (2006.01) |
| C23C 14/18 | (2006.01) |
| C23C 14/56 | (2006.01) |
| C03C 21/00 | (2006.01) |

(52) U.S. Cl.
CPC .......... *C03C 21/002* (2013.01); *C23C 14/083* (2013.01); *C23C 14/085* (2013.01); *C23C 14/185* (2013.01); *C23C 14/568* (2013.01); *C23C 14/5806* (2013.01); *C23C 14/5853* (2013.01); *G02F 1/153* (2013.01); *G02F 1/155* (2013.01); *G02F 1/1523* (2013.01); *H05K 3/10* (2013.01); *C03C 2217/73* (2013.01); *C03C 2217/94* (2013.01); *C03C 2218/154* (2013.01); *C03C 2218/355* (2013.01); *G02F 2001/1555* (2013.01); *Y10T 29/49124* (2015.01)

(56) References Cited

U.S. PATENT DOCUMENTS

| | | | | |
|---|---|---|---|---|
| 6,249,369 | B1 * | 6/2001 | Theiste | C09K 9/02 |
| | | | | 359/265 |
| 6,352,755 | B1 * | 3/2002 | Finley | C03C 17/245 |
| | | | | 204/192.1 |
| 7,372,610 | B2 | 5/2008 | Burdis et al. | |
| 7,829,147 | B2 * | 11/2010 | Aitken | C03C 3/12 |
| | | | | 204/192.29 |
| 8,164,818 | B2 | 2/2012 | Collins et al. | |
| 8,228,592 | B2 | 7/2012 | Wang et al. | |
| 8,300,298 | B2 | 10/2012 | Wang et al. | |
| 8,432,603 | B2 | 4/2013 | Wang et al. | |
| 8,582,193 | B2 | 11/2013 | Wang et al. | |
| 9,723,723 | B2 | 8/2017 | Rozbicki et al. | |
| 2003/0214697 | A1 * | 11/2003 | Duthaler | G02F 1/167 |
| | | | | 359/296 |
| 2003/0227663 | A1 | 12/2003 | Agrawal et al. | |
| 2008/0169185 | A1 * | 7/2008 | Burdis | G02F 1/1523 |
| | | | | 204/192.15 |
| 2008/0310007 | A1 * | 12/2008 | Agrawal | B82Y 20/00 |
| | | | | 359/275 |
| 2009/0323161 | A1 * | 12/2009 | Fuss | G02F 1/1533 |
| | | | | 359/275 |
| 2010/0165440 | A1 * | 7/2010 | Nguyen | G02F 1/155 |
| | | | | 359/275 |
| 2010/0243427 | A1 | 9/2010 | Kozlowski et al. | |
| 2011/0048614 | A1 | 3/2011 | Veerasamy | |
| 2011/0051220 | A1 * | 3/2011 | Lee | G02B 5/208 |
| | | | | 359/275 |
| 2011/0266137 | A1 | 11/2011 | Wang et al. | |
| 2011/0266138 | A1 | 11/2011 | Wang et al. | |
| 2012/0275008 | A1 | 11/2012 | Pradhan et al. | |
| 2014/0182125 | A1 | 7/2014 | Rozbicki et al. | |
| 2016/0200621 | A1 | 7/2016 | N'Gom et al. | |

OTHER PUBLICATIONS

U.S. Notice of Allowance dated May 26, 2017 in U.S. Appl. No. 14/137,750.

PCT International Search Report dated Jan. 2, 2013 dated PCT/US2012/043385.

Extended European Search Report dated Jan. 21, 2015 in EP Application No. 12802561.6.

PCT International Preliminary Report on Patentability dated Jan. 9, 2014 issued in PCT/US2012/043385.

EP Office Action dated Feb. 2, 2016 in EP Application No. 12802561.6.

EP Office Action dated Dec. 14, 2016 in EP Application No. 12802561.6.

EP Office Action dated Dec. 5, 2017 in EP Application No. 12802561.6.

\* cited by examiner

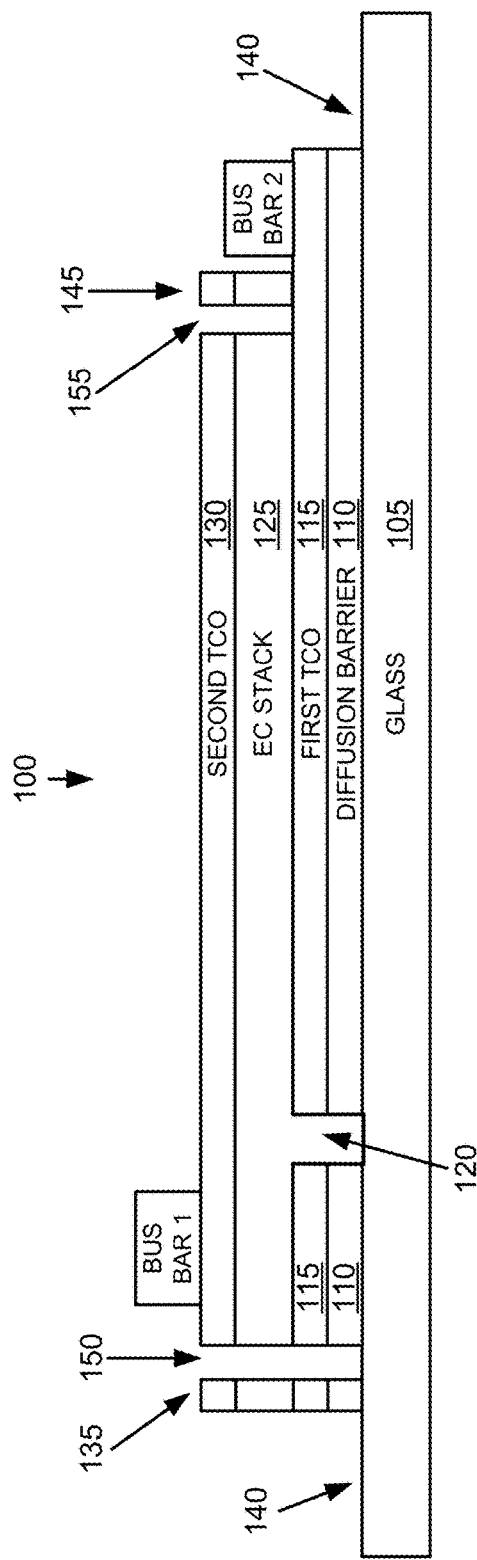
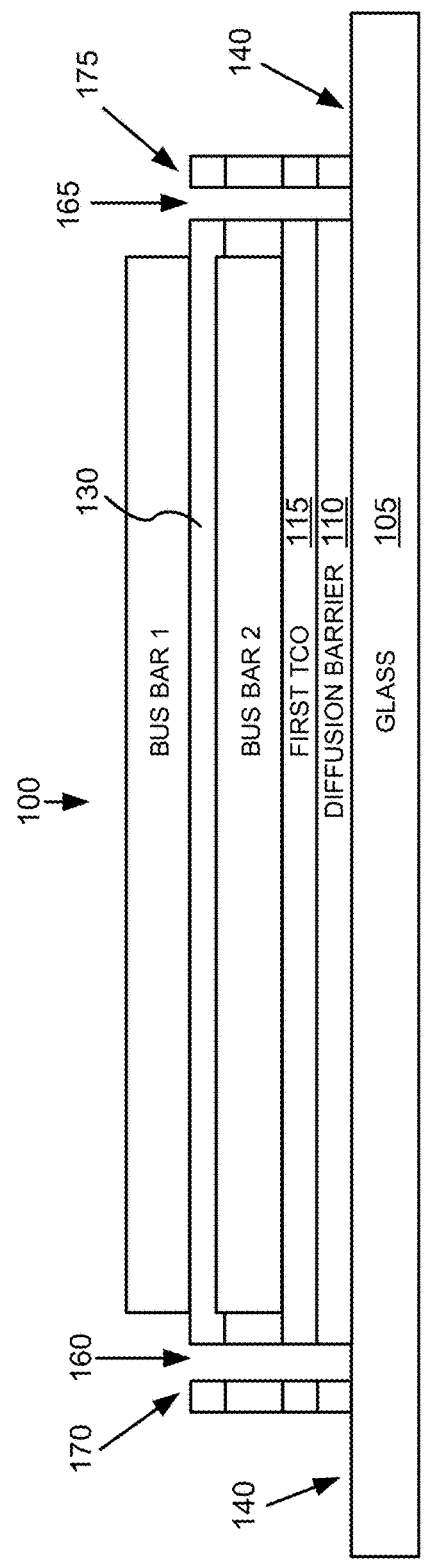

| Concept | Embodiment | Specific Embodiment(s) |
|---|---|---|
| Ion control | excess Li ions | additional Li ions added to stack during deposition to account for Li loss during temper |
| | Li activity-control | control Li in stack by increasing Li activity to control Li diffusion/location:<br>1. Li layer on the top and/or bottom surface<br>2. Li 'gas' on the surface during temper<br>3. Li compound ($Li_2CO_3$, etc.) applied on the top surface<br>4. Li interfacial layer<br>5. Li islands in the device<br>6. Li / Li compound core-shell morphology inside the stack |
| | Li diffusion layer | use Li diffusion layer inside the stack / interface to maintain Li content of the device |
| Interface | match CTE | match CTE of all layers to prevent thermal stress during tempering |
| Structure | crystalline EC/CE/IC materials | use materials which will maintain functionality in a crystalline state |
| | grain boundary pinning | introduce elements that will allow grain boundary pinning and prevent structure change during temper |
| | multiphase layer | multiphase (at least two phases) in one or more functional layers (EC,IC,CE) which prevents the change of the structure during temper |
| | IC thickness control | control following variables to maintain IC thickness to allow acceptable performance:<br>1. reduce Li dose in the 'interfacial IC region'<br>2. reduce high $O_2$ $WO_x$ layer thickness<br>3. reduce $O_2$ content in the $WO_x$ layer |

*Fig. 5A*

| Concept | Embodiment | Specific Embodiment(s) |
|---|---|---|
| Composition | cap layer | a) inert capping layer that prevents $O_2$ diffusion into/from stack<br>b) sacrificial Li layer which preserves the composition of the stack below the layer |
| Composition | lower stoichiometry deposition for the EC layer | deposit lower stoichiometry starting materials that are transformed to the final stoichiometry after tempering |
| Composition | temper w/inert gas | temper process (incl. quench) typically uses ambient air - use inert gas (Ar, Xn, Kr) or non-oxidizing gas ($N_2$) to prevent change in the metal-oxygen ratio in the stack |
| Composition | match $O_2$ activity in the stack | tempering heat load may lead to local redistribution of $O_2$ within stack (e.g., $O_2$ leaves NiWO layer and enters ITO layer) if the $O_2$ activity in the layers is very different - use materials (EC, IC, CE, ITO) such that $O_2$ activity in each layer is matched to fabricate temperable coatings |
| Composition | match Li activity in the stack | same as $O_2$ but for Li |
| Alternate Tempering Processes | selective (localized) heating | localize heating in the glass layer to reduce impact to the device:<br>1. use IR heating at wavelengths where there is high absorption in glass but lower absorption in the device stack<br>2. use low emissivity TCO and IR heating which will heat glass but prevent IR from reaching device stack |
| Alternate Tempering Processes | tunable thermal layer | together with localized heating, use a tunable thermal layer between glass and TCO which provides:<br>1. low thermal conductivity during temper (for reduced impact to device)<br>2. high thermal conductivity during device operation (for energy performance) |
| Alternate Tempering Processes | chemical strengthening | design EC device to allow chemical strengthening ion passage without device damage during chemical strengthening |
| Alternate Tempering Processes | chemical strengthening layer | provide a source of ions required for chemical strengthening between the glass and the bottom TCO, such that the ions don't have to diffuse through the EC stack during chemical strengthening |

*Fig. 5B*

TEMPERABLE ELECTROCHROMIC DEVICES

CROSS-REFERENCE TO RELATED APPLICATIONS

This application is a continuation of U.S. patent application Ser. No. 14/137,750, filed Dec. 20, 2013 and titled "TEMPERABLE ELECTROCHROMIC DEVICES," which is a continuation of PCT Application No. PCT/US2012/043385 (designating the United States), filed on Jun. 20, 2012 and titled "TEMPERABLE ELECTROCHROMIC DEVICES," which claims benefit of U.S. Provisional Patent Application No. 61/499,618, filed on Jun. 21, 2011 and titled "TEMPERABLE ELECTROCHROMIC DEVICES," each of which applications are hereby incorporated by reference in their entireties and for all purposes; U.S. patent application Ser. No. 14/137,750 is also a continuation-in-part of U.S. patent application Ser. No. 12/645,111, filed on Dec. 22, 2009 and titled "FABRICATION OF LOW DEFECTIVITY ELECTROCHROMIC DEVICES," now U.S. Pat. No. 9,664,974, which claims benefit of U.S. Provisional Patent Application No. 61/165,484, filed on Mar. 31, 2009 and titled "ALL-SOLID-STATE ELECTROCHROMIC DEVICE," each of which are hereby incorporated by reference in their entireties and for all purposes.

FIELD

The present disclosure concerns temperable electrochromic devices and related methods.

BACKGROUND

Glass tempering is a process by which glass is thermally treated to increase its strength. During tempering the glass is subjected to high heat until its softening point is reached and then the glass is rapidly cooled. This creates a tension zone in the interior of the glass, which is surrounded by a compression zone. These zones contribute to high stress within tempered glass. Glass generally needs to be cut or ground to a desired geometry before tempering, because, once tempered, the glass cannot be cut or it will suffer catastrophic breakage into small pieces due to the high stress imparted in the glass during tempering.

Conventionally, electronic devices, such as electrochromic devices, are fabricated on tempered glass. The desired size of glass is chosen; the glass is tempered and only then is the electronic device fabricated thereon. Thus, if a device is fabricated on a glass substrate and then the glass substrate is tempered, the device would be exposed to the tempering process. Conventionally, this process destroys functionality of the device.

SUMMARY

This disclosure provides systems, methods, and apparatus for tempering or chemically strengthening glass substrates having electrochromic devices fabricated thereon. In one aspect, an electrochromic device is fabricated on a glass substrate. The glass substrate is then tempered or chemically strengthened. The disclosed methods may reduce or prevent potential issues that the electrochromic device may experience during the tempering or the chemical strengthening processes.

One aspect of the subject matter described in this disclosure can be implemented in a method including fabricating an electrochromic device on a glass substrate and then tempering the glass substrate by heating the glass substrate.

Another aspect of the subject matter described in this disclosure can be implemented in a method including fabricating an electrochromic device on a glass substrate and then strengthening the glass substrate with a chemical process.

Another aspect of the subject matter described in this disclosure can be implemented in a method of forming an EC device on a chemically strengthened pane. The method includes coating an annealed glass pane with potassium nitrate and coating the annealed glass pane with an EC device including a layer at the interface between the potassium nitrate and the EC device. The layer protects the EC device from intrusion by potassium ions. The EC device and the annealed glass pane are then heated to between about 300° C. and about 400° C.

Another aspect of the subject matter described in this disclosure can be implemented in a method including fabricating an electrochromic device on a glass substrate. The electrochromic device includes more lithium than needed for a functional electrochromic device. The electrochromic device further includes a first transparent conducting oxide layer disposed on the substrate, a stack disposed on the first transparent conducting oxide layer, and a second transparent conducting oxide layer disposed on top of the stack. The stack includes an electrochromic layer comprising an electrochromic material and a counter electrode layer comprising a counter electrode material. The glass substrate is then tempered.

Another aspect of the subject matter described in this disclosure can be implemented in a method including fabricating an electrochromic device on a glass substrate. The electrochromic device includes a first transparent conducting oxide layer disposed on the substrate, a stack disposed on the first transparent conducting oxide layer, and a second transparent conducting oxide layer disposed on top of the stack. The stack includes an electrochromic layer comprising an electrochromic material and a counter electrode layer comprising a counter electrode material. Lithium ions in the electrochromic device are driven into the electrochromic layer, the counter electrode layer, and/or a region between the electrochromic layer and the counter electrode layer. After driving the lithium ions, the glass substrate is tempered.

Another aspect of the subject matter described in this disclosure can be implemented in a method including fabricating an electrochromic device disposed on a glass substrate, providing a lithium source disposed on a surface of the electrochromic device, and tempering the glass substrate.

Another aspect of the subject matter described in this disclosure can be implemented in a method including fabricating an electrochromic device on a glass substrate, providing a lithium diffusion barrier on a surface of the electrochromic device, and tempering the glass substrate.

Details of one or more implementations of the subject matter described in this specification are set forth in the accompanying drawings and the description below.

BRIEF DESCRIPTION OF THE DRAWINGS

The following detailed description can be more fully understood when considered in conjunction with the drawings in which:

FIGS. 1A-1C show schematic diagrams of electrochromic devices formed on glass substrates, i.e., electrochromic lites.

FIGS. 5A and 5B show tables summarizing some of the different embodiments disclosed herein.

DETAILED DESCRIPTION

Introduction

Figure 1C:
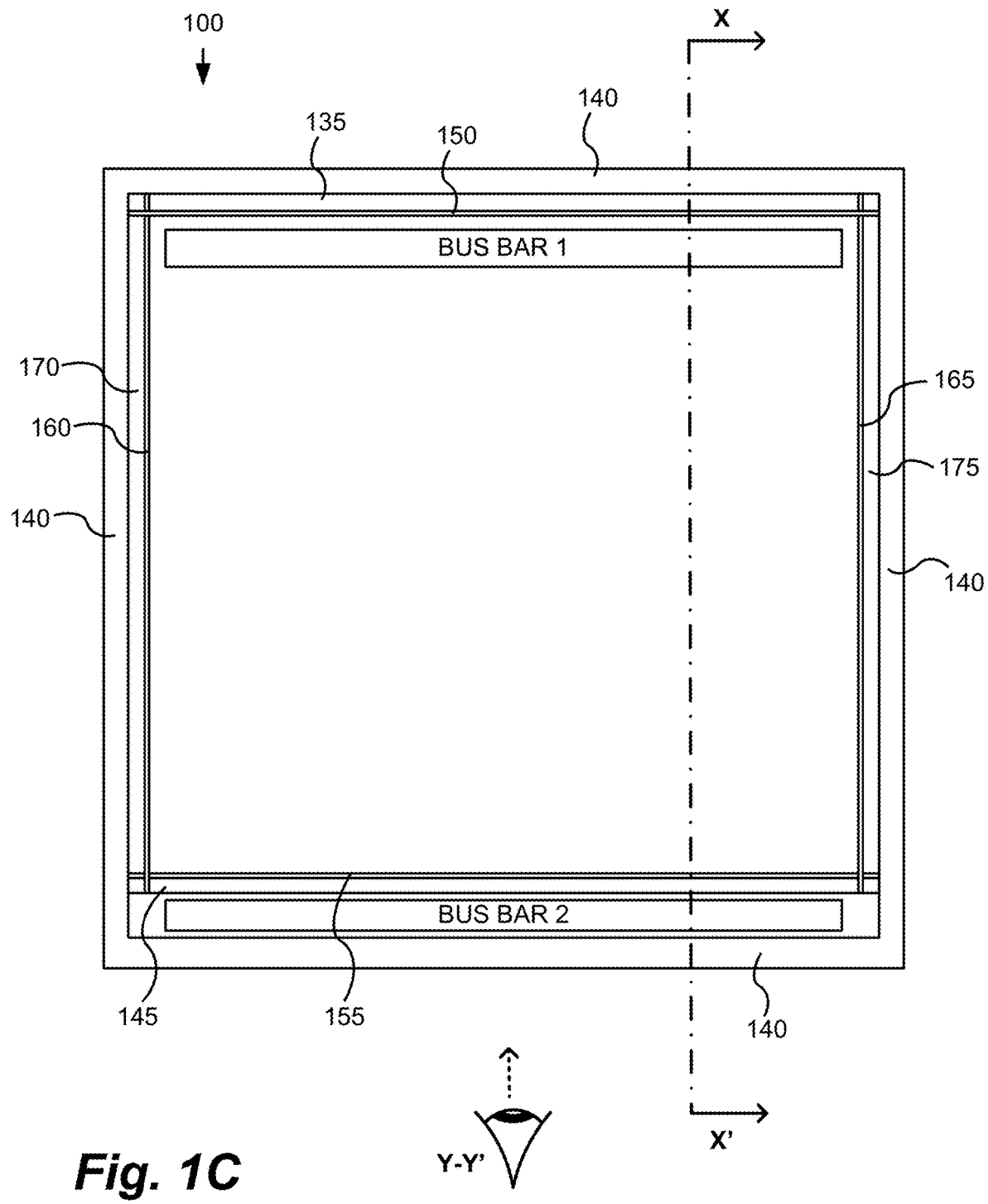

As described in U.S. patent application Ser. No. 12/941,882, filed Nov. 8, 2010, which is incorporated herein by reference in its entirety, it would be desirable to temper glass after an electrochromic device is formed thereon. In this way, electrochromic lites of varying sizes can be cut from a large-format non-tempered glass sheet and then the individual lites tempered. By tempering the EC lites after cutting them to desired sizes, the quality and the yield are enhanced because only those lites of high quality, for example, low defectivity, are chosen for the tempering process. This saves considerable energy because only the most desirable lites go through the tempering furnace, rather than tempering many lites and then choosing the best lites from the tempered lot.

The tempering of glass is typically conducted at a high temperature for a sufficient period of time that it may cause damage to or degradation of the electrochromic device. Typically, tempering is performed at a temperature above 600° C., for example, about 680° C., for several minutes. This heating process is followed by a very rapid quench which preserves internal stresses within the glass pane that were created by the heating. In some cases, solid state electrochromic devices are fabricated on a glass substrate which may begin to degrade over time when heated beyond about 350° C.

Among the potential problems that an electrochromic device might experience during tempering are (1) the loss of lithium or other charge carrying ion from the device, (2) the redistribution of lithium or other charge carrying ion within the device, (3) the modification of the morphology of one or more layers of the device by, for example, increasing the grain size of an electrochromic active layer, (4) the modification of the oxidation state of one or more materials in the electrochromic stack by, for example, the diffusion of oxygen into the device, out of the device, or within the device, and (5) the formation of an ion conducting layer or interfacial region between the electrochromic and counter electrode layers to a thickness that negatively impacts performance.

In this disclosure, various processing techniques are described which permit forming an electrochromic device on a glass substrate prior to tempering the glass substrate. Described are techniques to mitigate or ameliorate the damage or degradation that would otherwise occur to the electrochromic device during tempering. Thus, for example, devices are fabricated in order to minimize damage that tempering would otherwise impose on the devices, and/or the devices are fabricated to take advantage of the tempering conditions so that tempering yields lites with functional EC devices thereon. In some embodiments, the tempered EC lites are further processed in order to optimize their performance.

In this regard, many approaches to forming electrochromic devices are described. Certain suitable processes are described in U.S. patent application Ser. No. 12/645,111, filed Dec. 22, 2009, U.S. patent application Ser. No. 12/645,159, filed Dec. 22, 2009, and U.S. patent application Ser. No. 12/772,075, filed Apr. 30, 2010. Each of these disclosures is relevant and presents fabrication methods that may serve as baseline processes. Each of these patent applications is incorporated herein by reference in its entirety.

It should be understood that some of the process variations described herein may be extended to protecting devices other than electrochromic devices that might be formed on a glass substrate prior to tempering. For convenience, electrochromic devices will be used as the example in the following discussion. Certain all solid state electrochromic devices are often made from metal oxides, ceramics, and the like, i.e., materials that can withstand the tempering process; such all solid state devices are particularly well suited for methods described herein. Organic electrochromic materials tend not to be robust enough to survive tempering.

It should also be understood that the tempering process may be performed in line with or as part of the electrochromic device fabrication process. For example, a pane of glass may be passed through successive deposition stations where each station deposits some or all of a particular layer in the electrochromic device stack. Often, these stations will create the stack layers by a physical vapor deposition (PVD) process, which may be a plasma assisted process. One or more of the stations may also anneal the partially or completely fabricated device. Besides a conventional anneal, the stations may be configured to carry out a multistep thermochemical conditioning (MTCC), as described in U.S. patent application Ser. No. 12/772,055, filed on Apr. 30, 2010, entitled "Electrochromic Devices," naming Zhongchun Wang et al. as inventors, which is herein incorporated by reference. In accordance with various embodiments disclosed herein, one or more of the anneal operations normally performed in an electrochromic device fabrication process is dispensed with in favor of accomplishing the same physical transformation(s) during a downstream tempering process.

In some embodiments, the electrochromic device is first formed on the glass pane by a process such as that described herein and then tempering is conducted in a separate operation, e.g., after the glass pane on which the electrochromic device structure is formed is cut into one or more smaller panes sized for commercial products.

Overview of Electrochromic Devices

In order to orient the reader to the embodiments of systems, methods, and apparatus disclosed herein, a brief discussion of electrochromic devices is provided. This initial discussion of electrochromic devices is provided for context only, and the subsequently described embodiments of systems, methods, and apparatus are not limited to the specific features and fabrication processes of this initial discussion.

A particular example of an electrochromic lite is described with reference to FIGS. 1A-1C, in order to illustrate embodiments described herein. FIG. 1A is a cross-sectional representation (see cut X-X' of FIG. 1C) of an electrochromic lite, 100, which is fabricated starting with a glass sheet, 105. Lite 100 includes glass sheet 105 and fabricated thereon a diffusion barrier 110, e.g., a sodium diffusion barrier which blocks sodium ions in the glass from migrating to the device. On the diffusion barrier is a first transparent conductive oxide (TCO), 115, e.g., a fluorinated tin oxide, indium tin oxide, or similar transparent conducting material. Second TCO, 130, is the top layer. In between the TCOs are EC stack, 125, which can be, e.g., three layers including an electrochromic layer (EC), an ion-conducting (IC) electrically-insulating layer, and a counter electrode layer which may serve as an ion storage layer and also a complimentary coloring layer to the EC layer.

FIG. 1B shows an end view (see perspective Y-Y' of FIG. 1C) of EC lite 100, and FIG. 1C shows a top-down view of EC lite 100. FIG. 1A shows the electrochromic lite after fabrication on glass sheet 105, edge deleted to produce area, 140, around the perimeter of the lite. The electrochromic lite has also been laser scribed and bus bars have been attached. In this example, the edge deletion process removes both TCO 115 and diffusion barrier 110, but in other embodiments only the TCO is removed, leaving the diffusion barrier intact. The TCO 115 is the first of two conductive layers used to form the electrodes of the electrochromic device fabricated on the glass sheet. In this example, the glass sheet includes underlying glass and the diffusion barrier layer. Thus, in this example, the diffusion barrier is formed, and then the first TCO, an EC stack, 125, (for example, having electrochromic, ion conductor, and counter electrode layers), and a second TCO, 130, are formed. In one embodiment, the electrochromic device (EC stack and second TCO) is fabricated in an integrated deposition system where the glass sheet does not leave the integrated deposition system at any time during fabrication of the stack. In one embodiment, the first TCO layer is also formed using the integrated deposition system where the glass sheet does not leave the integrated deposition system during deposition of the EC stack and the (second) TCO layer. In one embodiment, all of the layers (diffusion barrier, first TCO, EC stack, and second TCO) are deposited in the integrated deposition system where the glass sheet does not leave the integrated deposition system during deposition. In this example, prior to deposition of EC stack 125, an isolation trench, 120, is cut through TCO 115 and diffusion barrier 110. Trench 120 is made in contemplation of electrically isolating an area of TCO 115 that will reside under bus bar 1 after fabrication is complete (see FIG. 1A). This is done to avoid charge buildup and coloration of the EC device under the bus bar, which can be undesirable.

After formation of the EC device, edge deletion processes and additional laser scribing are performed. FIG. 1A depicts areas 140 where the device has been removed, in this example, from a perimeter region surrounding laser scribe trenches, 150, 155, 160, and 165. Trenches 150, 160 and 165 pass through the EC stack and also through the first TCO and diffusion barrier. Trench 155 passes through second TCO 130 and the EC stack, but not the first TCO 115. Laser scribe trenches 150, 155, 160, and 165 are made to isolate portions of the EC device, 135, 145, 170, and 175, which were potentially damaged during edge deletion processes from the operable EC device. In this example, laser scribe trenches 150, 160, and 165 pass through the first TCO to aid in isolation of the device (laser scribe trench 155 does not pass through the first TCO, otherwise it would cut off bus bar 2's electrical communication with the first TCO and thus the EC stack). The laser or lasers used for the laser scribe processes are typically, but not necessarily, pulse-type lasers, for example, diode-pumped solid state lasers. For example, the laser scribe processes can be performed using a suitable laser from IPG Photonics (of Oxford, Mass.), or from Ekspla (of Vilnius, Lithuania). Scribing can also be performed mechanically, for example, by a diamond tipped scribe. One of ordinary skill in the art would appreciate that the laser scribing processes can be performed at different depths and/or performed in a single process whereby the laser cutting depth is varied, or not, during a continuous path around the perimeter of the EC device. In one embodiment, the edge deletion is performed to the depth of the first TCO.

After laser scribing is complete, bus bars are attached. Non-penetrating bus bar (1) is applied to the second TCO. Non-penetrating bus bar (2) is applied to an area where the device was not deposited (for example, from a mask protecting the first TCO from device deposition), in contact with the first TCO or, in this example, where an edge deletion process (for example, laser ablation using an apparatus having a XY or XYZ galvanometer) was used to remove material down to the first TCO. In this example, both bus bar 1 and bus bar 2 are non-penetrating bus bars. A penetrating bus bar is one that is typically pressed into and through the EC stack to make contact with the TCO at the bottom of the stack. A non-penetrating bus bar is one that does not penetrate into the EC stack layers, but rather makes electrical and physical contact on the surface of a conductive layer, for example, a TCO.

The TCO layers can be electrically connected using a non-traditional bus bar, for example, a bus bar fabricated with screen and lithography patterning methods. In one embodiment, electrical communication is established with the device's transparent conducting layers via silk screening (or using another patterning method) a conductive ink followed by heat curing or sintering the ink. Advantages to using the above described device configuration include simpler manufacturing, for example, and less laser scribing than conventional techniques which use penetrating bus bars.

After the bus bars are connected, the device is integrated into an insulated glass unit (IGU), which includes, for example, wiring the bus bars and the like. In some embodiments, one or both of the bus bars are inside the finished IGU, however in one embodiment one bus bar is outside the seal of the IGU and one bus bar is inside the IGU. In the former embodiment, area 140 is used to make the seal with one face of the spacer used to form the IGU. Thus, the wires or other connection to the bus bars runs between the spacer and the glass. As many spacers are made of metal, for example, stainless steel, which is conductive, it is desirable to take steps to avoid short circuiting due to electrical communication between the bus bar and connector thereto and the metal spacer.

Figure 2A:
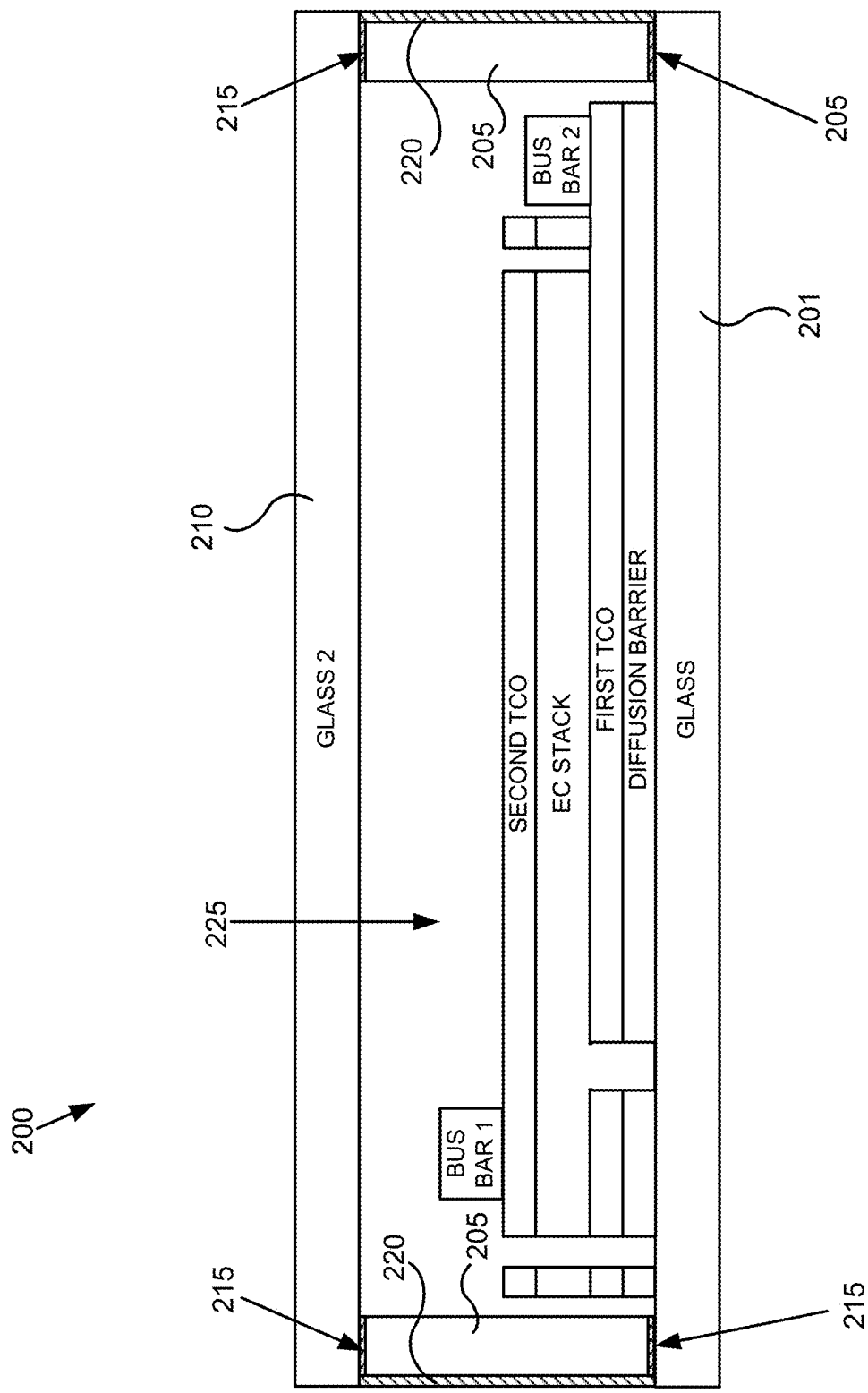
FIGS. 2A and 2B show cross-sectional schematic diagrams of the electrochromic lites as described in relation to FIGS. 1A-C integrated into an IGU.
Figure 2B:
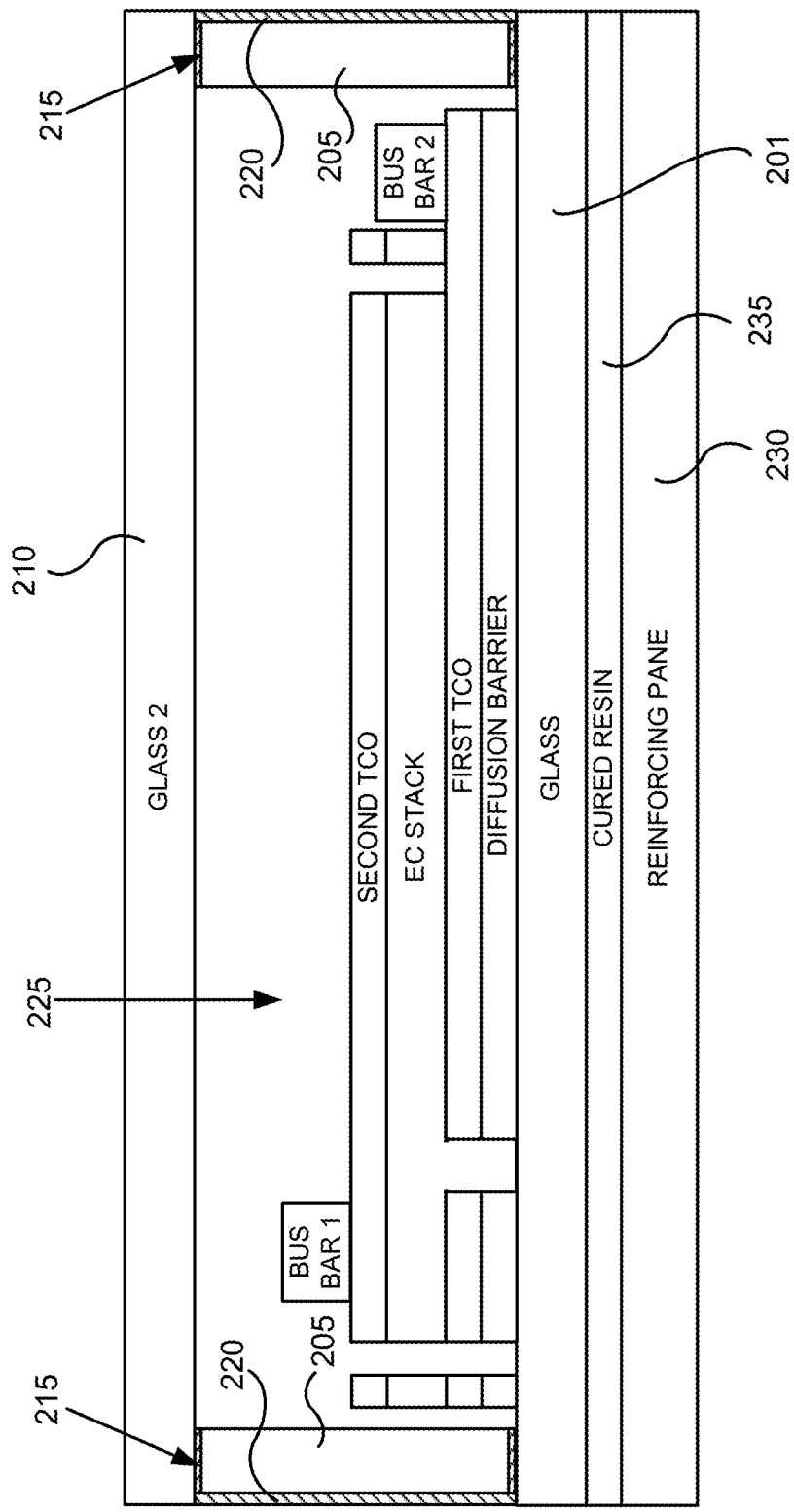

As described above, after the bus bars are connected, the electrochromic lite is integrated into an IGU, which includes, for example, wiring for the bus bars and the like. In the embodiments described herein, both of the bus bars are inside the primary seal of the finished IGU. FIG. 2A shows a cross-sectional schematic diagram of the electrochromic window as described in relation to FIGS. 1A-C integrated into an IGU, 200. A spacer, 205, is used to separate the electrochromic lite from a second lite, 210. Second lite 210 in IGU 200 is a non-electrochromic lite, however, the embodiments disclosed herein are not so limited. For example, lite 210 can have an electrochromic device thereon and/or one or more coatings such as low-E coatings and the like. Lite 201 can also be laminated glass, such as depicted in FIG. 2B (lite 201 is laminated to reinforcing pane, 230, via resin, 235). Between spacer 205 and the first TCO layer of the electrochromic lite is a primary seal material, 215. This primary seal material is also between spacer 205 and second glass lite 210. Around the perimeter of spacer 205 is a secondary seal, 220. Bus bar wiring/leads traverse the seals for connection to a controller. Secondary seal 220 may be much thicker that depicted. These seals aid in keeping moisture out of an interior space, 225, of the IGU. They also serve to prevent argon or other gas in the interior of the IGU from escaping.

Figure 3A:
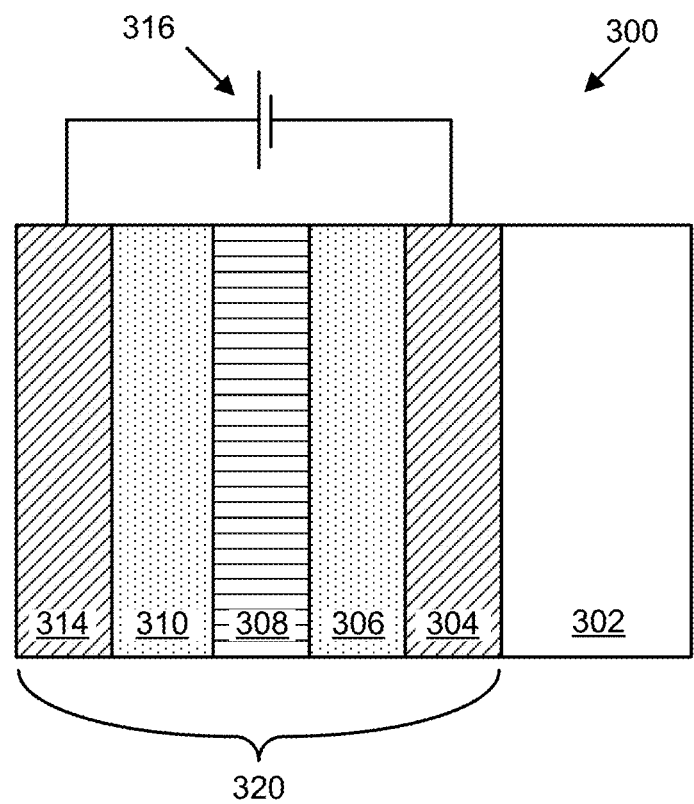
FIG. 3A depicts a schematic cross-section of an electrochromic device.

FIG. 3A schematically depicts an electrochromic device, 300, in cross-section. Electrochromic device 300 includes a substrate, 302, a first conductive layer (CL), 304, an electrochromic layer (EC), 306, an ion conducting layer (IC), 308, a counter electrode layer (CE), 310, and a second conductive layer (CL), 314. Layers 304, 306, 308, 310, and 314 are collectively referred to as an electrochromic stack 320. A voltage source 316 operable to apply an electric potential across electrochromic stack 320 effects the transition of the electrochromic device from, for example, a bleached state to a colored state (depicted). The order of layers can be reversed with respect to the substrate.

Electrochromic devices having distinct layers as described can be fabricated as all solid state devices and/or all inorganic devices having low defectivity. Such devices and methods of fabricating them are described in more detail in U.S. patent application Ser. No. 12/645,111, entitled, "Fabrication of Low-Defectivity Electrochromic Devices," filed on Dec. 22, 2009 and naming Mark Kozlowski et al. as inventors, and in U.S. patent application Ser. No. 12/645,159, entitled, "Electrochromic Devices," filed on Dec. 22, 2009 and naming Zhongchun Wang et al. as inventors, both of which are incorporated by reference herein for all purposes. It should be understood, however, that any one or more of the layers in the stack may contain some amount of organic material. The same can be said for liquids that may be present in one or more layers in small amounts. It should also be understood that solid state material may be deposited or otherwise formed by processes employing liquid components such as certain processes employing sol-gels or chemical vapor deposition.

Additionally, it should be understood that the reference to a transition between a bleached state and colored state is non-limiting and suggests only one example, among many, of an electrochromic transition that may be implemented. Unless otherwise specified herein (including the foregoing discussion), whenever reference is made to a bleached-colored transition, the corresponding device or process encompasses other optical state transitions such as non-reflective-reflective, transparent-opaque, etc. Further, the term "bleached" refers to an optically neutral state, for example, uncolored, transparent, or translucent. Still further, unless specified otherwise herein, the "color" of an electrochromic transition is not limited to any particular wavelength or range of wavelengths. As understood by those of skill in the art, the choice of appropriate electrochromic and counter electrode materials governs the relevant optical transition.

In embodiments described herein, the electrochromic device reversibly cycles between a bleached state and a colored state. In some cases, when the device is in a bleached state, a potential is applied to the electrochromic stack 320 such that available ions in the stack reside primarily in the counter electrode 310. When the potential on the electrochromic stack is reversed, the ions are transported across the ion conducting layer 308 to the electrochromic material 306 and cause the material to transition to the colored state.

Referring again to FIG. 3A, voltage source 316 may be configured to operate in conjunction with radiant and other environmental sensors. As described herein, voltage source 316 interfaces with a device controller (not shown in this figure). Additionally, voltage source 316 may interface with an energy management system that controls the electrochromic device according to various criteria such as the time of year, time of day, and measured environmental conditions. Such an energy management system, in conjunction with large area electrochromic devices (for example, an electrochromic window), can dramatically lower the energy consumption of a building.

Any material having suitable optical, electrical, thermal, and mechanical properties may be used as substrate 302. Such substrates include, for example, glass, plastic, and mirror materials. Suitable glasses include either clear or tinted soda lime glass, including soda lime float glass. The glass may be tempered or untempered.

In many cases, the substrate is a glass pane sized for residential window applications. The size of such glass pane can vary widely depending on the specific needs of the residence. In other cases, the substrate is architectural glass. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, for example, as large as about 80 inches by 120 inches. Architectural glass is typically at least about 2 mm thick, typically between about 3 mm and about 6 mm thick. Of course, electrochromic devices are scalable to substrates smaller or larger than architectural glass. Further, the electrochromic device may be provided on a mirror of any size and shape.

On top of substrate 302 is conductive layer 304. In certain embodiments, one or both of the conductive layers 304 and 314 is inorganic and/or solid. Conductive layers 304 and 314 may be made from a number of different materials, including conductive oxides, thin metallic coatings, conductive metal nitrides, and composite conductors. Typically, conductive layers 304 and 314 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like. Since oxides are often used for these layers, they are sometimes referred to as "transparent conductive oxide" (TCO) layers. Thin metallic coatings that are substantially transparent may also be used.

The function of the conductive layers is to spread an electric potential provided by voltage source 316 over surfaces of the electrochromic stack 320 to interior regions of the stack, with relatively little ohmic potential drop. The electric potential is transferred to the conductive layers though electrical connections to the conductive layers. In some embodiments, bus bars, one in contact with conductive layer 304 and one in contact with conductive layer 314, provide the electric connection between the voltage source 316 and the conductive layers 304 and 314. The conductive layers 304 and 314 may also be connected to the voltage source 316 with other conventional means.

Overlaying conductive layer 304 is electrochromic layer 306. In some embodiments, electrochromic layer 306 is inorganic and/or solid. The electrochromic layer may contain any one or more of a number of different electrochromic materials, including metal oxides. Such metal oxides include tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$) and the like. During operation, electrochromic layer 306 transfers ions to and receives ions from counter electrode layer 310 to cause optical transitions.

Generally, the colorization (or change in any optical property—for example, absorbance, reflectance, and transmittance) of the electrochromic material is caused by reversible ion insertion into the material (for example, intercalation) and a corresponding injection of a charge balancing electron. Typically some fraction of the ions responsible for the optical transition is irreversibly bound up in the electrochromic material. Some or all of the irreversibly bound ions are used to compensate "blind charge" in the material. In most electrochromic materials, suitable ions include lithium ions ($Li^+$) and hydrogen ions ($H^+$) (that is, protons). In some cases, however, other ions will be suitable. In various embodiments, lithium ions are used to produce the electrochromic phenomena. Intercalation of lithium ions into tungsten oxide ($WO_{3-y}$ ($0<y\leq\sim0.3$)) causes the tungsten oxide to change from transparent (bleached state) to blue (colored state).

Referring again to FIG. 3A, in electrochromic stack 320, ion conducting layer 308 is sandwiched between electrochromic layer 306 and counter electrode layer 310. In some embodiments, counter electrode layer 310 is inorganic and/or solid. The counter electrode layer may comprise one or more of a number of different materials that serve as a reservoir of ions when the electrochromic device is in the bleached state. During an electrochromic transition initiated by, for example, application of an appropriate electric potential, the counter electrode layer transfers some or all of the ions it holds to the electrochromic layer, changing the electrochromic layer to the colored state. Concurrently, in the case of NiWO, the counter electrode layer colors with the loss of ions.

In some embodiments, suitable materials for the counter electrode complementary to $WO_3$ include nickel oxide (NiO), nickel tungsten oxide (NiWO), nickel vanadium oxide, nickel chromium oxide, nickel aluminum oxide, nickel manganese oxide, nickel magnesium oxide, chromium oxide ($Cr_2O_3$), manganese oxide ($MnO_2$), and Prussian blue.

When charge is removed from a counter electrode 310 made of nickel tungsten oxide (that is, ions are transported from counter electrode 310 to electrochromic layer 306), the counter electrode layer will transition from a transparent state to a colored state.

In the depicted electrochromic device, between electrochromic layer 306 and counter electrode layer 310, there is the ion conducting layer 308. Ion conducting layer 308 serves as a medium through which ions are transported (in the manner of an electrolyte) when the electrochromic device transitions between the bleached state and the colored state. Preferably, ion conducting layer 308 is highly conductive to the relevant ions for the electrochromic and the counter electrode layers, but has sufficiently low electron conductivity that negligible electron transfer takes place during normal operation. A thin ion conducting layer with high ionic conductivity permits fast ion conduction and hence fast switching for high performance electrochromic devices. In certain embodiments, the ion conducting layer 308 is inorganic and/or solid.

Examples of suitable ion conducting layers (for electrochromic devices having a distinct IC layer) include silicates, silicon oxides, tungsten oxides, tantalum oxides, niobium oxides, and borates. These materials may be doped with different dopants, including lithium. Lithium doped silicon oxides include lithium silicon-aluminum-oxide. In some embodiments, the ion conducting layer comprises a silicate-based structure. In some embodiments, a silicon-aluminum-oxide (SiAlO) is used for the ion conducting layer 308.

Electrochromic device 300 may include one or more additional layers (not shown), such as one or more passive layers. Passive layers used to improve certain optical properties may be included in electrochromic device 300. Passive layers for providing moisture or scratch resistance may also be included in electrochromic device 300. For example, the conductive layers may be treated with anti-reflective or protective oxide or nitride layers. Other passive layers may serve to hermetically seal electrochromic device 300.

Figure 3B:
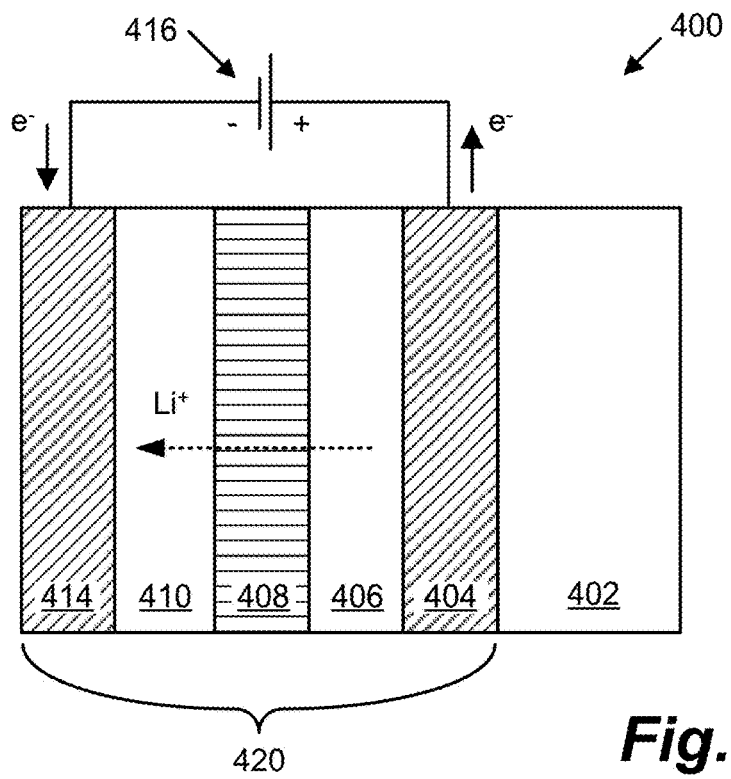
FIG. 3B depicts a schematic cross-section of an electrochromic device in a bleached state (or transitioning to a bleached state).

FIG. 3B is a schematic cross-section of an electrochromic device in a bleached state (or transitioning to a bleached state). In accordance with specific embodiments, an electrochromic device, 400, includes a tungsten oxide electrochromic layer (EC), 406, and a nickel-tungsten oxide counter electrode layer (CE), 410. Electrochromic device 400 also includes a substrate, 402, a conductive layer (CL), 404, an ion conducting layer (IC), 408, and conductive layer (CL), 414.

A power source, 416, is configured to apply a potential and/or current to an electrochromic stack, 420, through suitable connections (for example, bus bars) to the conductive layers, 404 and 414. In some embodiments, the voltage source is configured to apply a potential of a few volts in order to drive a transition of the device from one optical state to another. The polarity of the potential as shown in FIG. 3A is such that the ions (lithium ions in this example) primarily reside (as indicated by the dashed arrow) in nickel-tungsten oxide counter electrode layer 410.

Figure 3C:
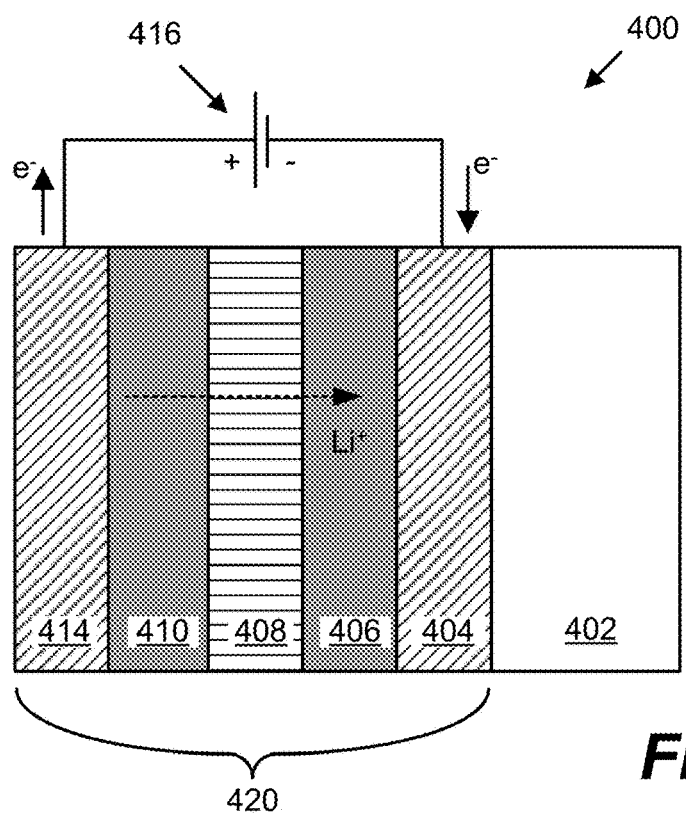
FIG. 3C depicts a schematic cross-section of the electrochromic device shown in FIG. 3B, but in a colored state (or transitioning to a colored state).

FIG. 3C is a schematic cross-section of electrochromic device 400 shown in FIG. 3B but in a colored state (or transitioning to a colored state). In FIG. 3C, the polarity of voltage source 416 is reversed, so that the electrochromic layer is made more negative to accept additional lithium ions, and thereby transition to the colored state. As indicated by the dashed arrow, lithium ions are transported across ion conducting layer 408 to tungsten oxide electrochromic layer 406. Tungsten oxide electrochromic layer 406 is shown in the colored state. Nickel-tungsten oxide counter electrode 410 is also shown in the colored state. As explained, nickel-tungsten oxide becomes progressively more opaque as it gives up (deintercalates) lithium ions. In this example, there is a synergistic effect where the transition to colored states for both layers 406 and 410 are additive toward reducing the amount of light transmitted through the stack and substrate.

As described above, an electrochromic device may include an electrochromic (EC) electrode layer and a counter electrode (CE) layer separated by an ionically conductive (IC) layer that is highly conductive to ions and highly resistive to electrons. As conventionally understood, the ionically conductive layer therefore prevents shorting between the electrochromic layer and the counter electrode layer. The ionically conductive layer allows the electrochromic and counter electrodes to hold a charge and thereby maintain their bleached or colored states. In electrochromic devices having distinct layers, the components form a stack which includes the ion conducting layer sandwiched between the electrochromic electrode layer and the counter electrode layer. The boundaries between these three stack components are defined by abrupt changes in composition and/or microstructure. Thus, the devices have three distinct layers with two abrupt interfaces.

In accordance with certain embodiments, the counter electrode and electrochromic electrodes are formed immediately adjacent one another, sometimes in direct contact, without separately depositing an ionically conducting layer. In some embodiments, electrochromic devices having an interfacial region rather than a distinct IC layer are employed. Such devices, and methods of fabricating them, are described in U.S. patent application Ser. Nos. 12/772,055 and 12/772,075, each filed on Apr. 30, 2010, and in U.S. patent application Ser. Nos. 12/814,277 and 12/814,279, each filed on Jun. 11, 2010—each of the four applications is entitled "Electrochromic Devices," each names Zhongchun Wang et al. as inventors, and each is incorporated by reference herein in its entirety.

In some embodiments, an electrochromic device includes a single layer graded composition including an EC region, an IC region, and a CE region, respectively. Such a single layer graded composition may be called an EC element. In certain embodiments, the EC element is all solid-state and inorganic. The EC element functions as an EC device, but is a single layer, not multiple layers, one stacked upon the other, as in conventional practice. In certain embodiments, the EC element includes transition metal oxides, alkali metals, and mixed transition metal oxides. One embodiment is an EC device including a first transparent electrode, a second transparent electrode, and the EC element sandwiched in between the first and second transparent electrodes. In one embodiment, an EC element includes transparent conducting regions as well, i.e., a fully functioning EC element that is a single coating on a substrate, the single layer having graded functional regions within it. EC elements are further described in U.S. patent application Ser. No. 13/462,725, filed on May 2, 2012, which is incorporated by reference herein in its entirety. In some embodiments, tempering the glass substrate may aid in forming the graded composition of an EC element. In some embodiments, an EC element may be less prone to damage during the tempering processes described herein. For example, an EC device including a distinct electrochromic layer, a distinct ion conducting layer, and a distinct counter electrode layer may be prone to damage during tempering due to different thermal expansion coefficients of each of the layers. An EC element, being a single graded layer, i.e., not having these distinct boundaries between layers, does not experience shearing forces between sub-layers because there are no distinct boundaries between sublayers in an EC element. One embodiment is a method of forming a functional EC element on a glass sheet, the method including fabricating the EC element on the glass sheet and then tempering the glass sheet.

Overview of Fabricating a Portion of an IGU Including an Electrochromic Device

Figure 4:
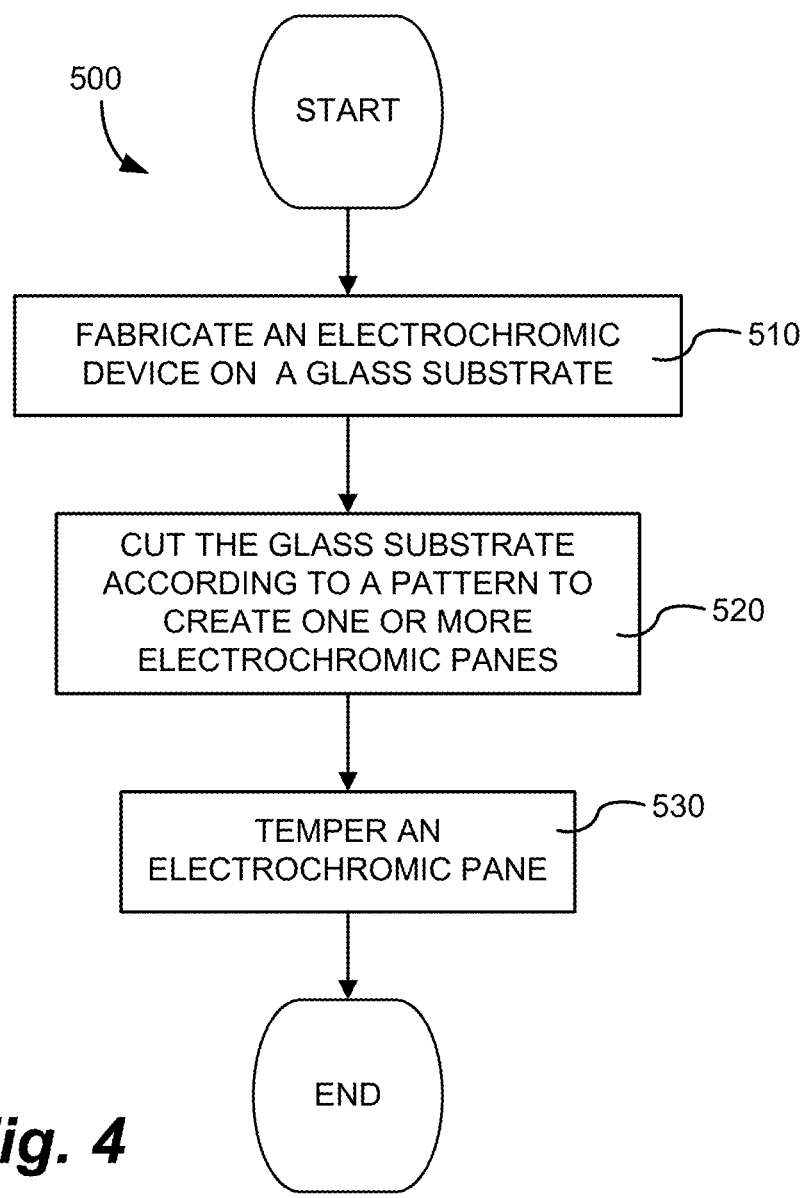
FIG. 4 shows a flow chart of a method for fabricating a portion of an IGU.

FIG. 4 shows a flow chart of a method for fabricating a portion of an IGU. For example, a method, 500, shown in FIG. 4 may be used to fabricate a pane, including an electrochromic device, of an IGU. Starting at operation 510 of method 500, an electrochromic device is fabricated on a glass substrate. Typically, an electrochromic device is fabricated on a large glass substrate that is intended to be cut into smaller panes at a later stage of the process. For example, the glass substrate may be a piece of glass of between about 3 meters and about 6 meters in length on at least one side. In some cases, the glass substrate is rectangular, being about 3 to 6 meters high and about 1.5 to 3 meters wide. In a specific embodiment, the glass substrate is about 2 meters wide and about 3 meters high. In one embodiment, the glass substrate is about six feet by ten feet.

Suitable glass for the glass substrate includes float glass, Gorilla® Glass (a trade name for alkali-aluminosilicate sheet glass available from Dow Corning, Corp. of Midland, Mich.) and the like.

In one embodiment, the glass substrate is float glass, optionally coated with a transparent conducting oxide (TCO) and a diffusion barrier layer. Examples of such glasses include conductive layer coated glasses sold under the trademark TEC® Glass by Pilkington, of Toledo, Ohio and SUNGATE® 300 and SUNGATE® 500 by PPG Industries of Pittsburgh, Penn. The glass substrate has a size that is at least equal to the largest EC glass pane contemplated for manufacture. TEC® Glass is a glass coated with a fluorinated tin oxide conductive layer. Such glass typically also has a diffusion barrier layer between the TCO and the float glass to prevent sodium from diffusing from the glass into the TCO. In one embodiment, the glass substrate does not have a preformed TCO or diffusion barrier on it, for example, in one embodiment the diffusion barrier, a first TCO, an electrochromic stack and a second TCO are all formed in a single apparatus under a controlled ambient environment.

For the fabrication of the electrochromic device, in the event that the glass sheet includes a preformed diffusion barrier and TCO, then the electrochromic device uses the TCO as one of its conductors. In the event the glass sheet is float glass without any preformed coatings, then operation 510 may involve initially depositing a diffusion barrier layer, then a transparent conductor (typically a TCO) layer, and thereafter the remainder of the electrochromic device is formed. This includes an electrochromic stack having an electrochromic (EC) layer, a counter electrode (CE) layer and an ion conducting (IC) layer. After forming the electrochromic stack, another transparent conductor layer (typically a TCO layer) is deposited as a second conductor (to deliver power to the EC stack). At this point, the electrochromic device is completed and operation 510 is concluded. One or more capping layers may also be applied. In one example, a hermetic layer is applied to keep moisture out of the device. In another example, a low-E (emissivity) coating is applied.

In operation 520, the glass substrate is cut according to a pattern to create one or more electrochromic panes. In some embodiments, other operations may occur prior to operation 520, including defining the cutting pattern, as described in U.S. patent application Ser. No. 12/941,882, filed Nov. 8, 2010. The cutting can be accomplished by any suitable process. In some cases, the cutting is accompanied by an edge finishing operation. Mechanical cutting typically involves scoring the glass with a hard tool, such as a diamond tip on a wheel, followed by breaking the glass along the score line. Thus, mechanical cutting includes "scoring" and breaking. Sometimes the term "scoring" is referred to as "scribing" in the glass window fabrication industry.

Cutting can produce microcracks and internal stresses proximate the cut. These can result in chipping or breaking of the glass, particularly near the edges. To mitigate the problems produced by cutting, cut glass may be subject to edge finishing, for example, by mechanical and/or laser methods. Mechanical edge finishing typically involves grinding with, for example, a grinding wheel containing clay, stone, diamond, etc. Typically, water flows over edge during mechanical edge finishing. The resulting edge surface is relatively rounded and crack free. Laser edge finishing typically produces a flat, substantially defect free surface. For example, an initial cut through the glass, perpendicular to the surface of the glass, may make a substantially defect free cut. However the right angle edges at the perimeter of the glass are susceptible to breakage due to handling. In some embodiments, a laser is used subsequently to cut off these 90 degree edges to produce a slightly more rounded or polygonal edge.

Examples of cutting and optional edge finishing processes include the following: (1) mechanical cutting, (2) mechanical cutting and mechanical edge finishing, (3) laser cutting, (4) laser cutting and mechanical edge finishing, and (5) laser cutting and laser edge finishing.

In one embodiment, the panes are cut from the glass sheet in a manner that actually strengthens and/or improves the edge quality of the resulting panes. In a specific example, this is accomplished using laser induced scoring by tension. In this method, a gas laser, for example a $CO_2$ laser with a wavelength of 10.6 micrometers, is used to heat the surface of the glass along a cut line to produce a compressive stress in the glass along the cut line. A cooling device, for example a gas and/or water jet, is used to quickly cool the heated line. This causes a score to form in the glass along the cutting line. The glass is then broken along the score by, for example, a conventional mechanical breaking device. Using this method, the cut lines are extremely clean, that is, there are minimal if any defects in the glass that can propagate and cause further breakage due to stresses applied to the pane. In one embodiment, the edges are subsequently mechanically and/or laser finished to remove the 90 degree edges to create a more rounded and/or polygonal edge.

In operation 530, an EC pane is tempered using a method as disclosed herein. Further operations, also described in U.S. patent application Ser. No. 12/941,882, filed Nov. 8, 2010, may be performed prior to incorporating the EC pane into an IGU.

Tempering

During a thermal tempering process, a glass substrate is heated to about 680° C. or higher and then quenched rapidly to increase the glass strength. Due to the sensitivity of the EC device to high temperatures, certain embodiments include tempering methods which reduce the thermal load to the device. In one embodiment, reduction of the thermal load is achieved by localized heating of the glass substrate. In one embodiment, this localized heating is performed by infrared (IR) heating of the glass substrate including the EC device with a wavelength/frequency of light at which the glass substrate absorbs substantially greater energy than the EC device. In another embodiment, an extremely low emissivity bottom TCO layer is used and IR energy is applied to the glass substrate on the face opposite the EC device. The IR energy impinging the layer of the low emissivity TCO will reflect most of the IR energy back into the glass, thus selectively heating and tempering the glass and preventing substantial energy transmission to the EC device.

In addition to reducing IR absorption in the EC device, the thermal conductivity between the glass and the EC device (including the bottom TCO) may be reduced during thermal tempering. However, for the EC device to provide a maximum energy savings benefit during operation, the thermal conductivity between the EC device and the glass should be high. In one embodiment, a variable thermal conductivity layer is formed between EC device and the glass. The variable thermal conductivity layer is placed in a low thermal conductivity state during the tempering process and placed in a high thermal conductivity state post-tempering during normal EC device functioning. The thermal conductivity of the variable thermal conductivity layer could be modified by an external stimulus, such as an electrical, an optical, or an acoustic signal, etc. The variable thermal conductivity layer also could be engineered to change thermal conductivity over time during the course of the tempering process.

In certain embodiments, a capping layer is used to ameliorate possible negative effects of tempering on the EC stack materials, including the loss of lithium due to oxidation. In one embodiment, a capping layer includes an oxygen barrier material that prevents oxygen diffusion into and out of the EC stack during tempering. In this embodiment, the diffusion barrier is substantially transparent. In one embodiment, the capping layer includes at least one of silicon dioxide, silicon aluminum oxide, silicon nitride, and silicon oxynitride.

In one embodiment, the capping layer is a sacrificial layer. In such embodiments, the capping layer need not be transparent because it may be removed after and/or during the tempering process. Also, the material for the sacrificial capping layer may be chosen such that it is easy to remove and/or it does not adhere well to the transparent conductive oxide used for the top electrode (for example, indium tin oxide) of the EC stack. Such materials may include silicon, titanium, and aluminum. For example, in one embodiment, the sacrificial capping layer is silicon. The silicon layer is oxidized to silicon dioxide during the tempering process. The silicon dioxide layer may be removed using chemically selective removal, for example, hydrofluoric acid (HF) may be used to remove the sacrificial capping layer while leaving the transparent conductive oxide substantially intact or at least in functional form. In one embodiment, the sacrificial layer is mechanically removed. In another embodiment, the sacrificial layer is etched using a plasma. In one embodiment, the sacrificial layer is removed by ion milling. In another embodiment, the sacrificial layer is removed by laser ablation. In one embodiment, the sacrificial layer is removed by exposure to irradiation, e.g., excimer laser, to maximize thermal expansion of the sacrificial layer as compared to the underlying EC device. The sacrificial layer is thus removed by shearing forces, i.e., it peels off or breaks off in pieces as is shatters under the shearing stress imparted by the excimer laser. EC elements are particularly well suited for methods employing shearing forces to remove the sacrificial layer, because EC elements do not have sublayers that are subject to such shearing forces and thus more shearing force can be used to remove the sacrificial layer.

In one embodiment, the sacrificial layer blocks and/or aids in preventing lithium from leaving the EC stack during tempering. For example, in one embodiment a sacrificial layer of lithium metal is deposited on the EC stack prior to tempering. During the tempering process, some or all of the lithium layer is lost but it aids in preventing the lithium in the EC device (deposited as part of the EC device formation) from leaving the stack during tempering. In another embodiment, the sacrificial layer is a lithium alloy or a lithium intermetallic (for example, a lithium aluminum alloy or a lithium silicon alloy). During tempering, the alloy or intermetallic provides lithium to the device. The remaining alloy or intermetallic is removed after tempering, for example, by plasma etching. In one embodiment, the lithium alloy or intermetallic is applied over a layer of lithium metal.

In certain embodiments, the stoichiometry of one or more of the materials of the EC device stack is selected such that when the EC stack is exposed to the tempering process conditions, a desired stoichiometry and performance results. In one embodiment, at least one of the lithium dose and the oxygen content are lowered in one more layers of the EC stack. In one embodiment, the lithium dose in a region that is ultimately converted into a region that functions as an IC layer is lowered prior to tempering. In one embodiment, the oxygen content of what is normally a superstoichiometric oxygenated region is lowered to a stoichiometric or substoichiometric amount of oxygen. In this way, oxygen that diffuses into the EC stack during tempering is used to form the desired stoichiometry during tempering. In one embodiment the oxygen levels of a tungsten oxide layer are lowered.

In one embodiment, the thickness of a superstoichiometric tungsten oxide layer is made thinner than it would have been in the absence of processing under tempering conditions. This reduces the overall oxygen content in the layer and accounts for oxygen from the ambient diffusing into the stack during tempering.

In another embodiment, the oxygen content in one more layers of the EC stack is increased above its target value. During the tempering process, some of this excess oxygen is released from the EC stack and this results in the desired oxygen content following the tempering process.

In certain embodiments, at least one of the oxygen content and the lithium content of the individual layers of the EC stack are chosen so that during the high temperatures encountered during tempering, there is minimal migration and/or redistribution of the species between the layers. For example, during tempering lithium and oxygen are species that readily diffuse through the EC stack. Depending on a particular layer's relative ability to permit or resist diffusion of the species as compared to other layers in the stack, there can be stresses generated in the EC stack as the species diffuse through the EC stack, for example, transitioning from diffusion through one material and into another material. Although not necessarily the best for the performance desired in the final EC device, the oxygen and/or lithium levels in each of the EC stack layers may be chosen such that migration and/or redistribution is minimized during tempering. The lithium and/or oxygen content of each of the layers may not be equal prior to tempering, rather the content of each layer may be specified such that minimal diffusion occurs during tempering. For example, lithium may preferentially migrate toward a particular layer during heating due to a gradient of lithium across two material layers. The lithium content of each of the layers may be selected to minimize this gradient.

In some embodiments, the glass substrate is tempered with the EC stack thereon, but under an inert atmosphere. In one embodiment, this includes inert atmosphere both during the heating stage of tempering and during the cooling or quenching stage of the tempering. One or more noble gases and/or nitrogen can be used. Although not wishing to be bound by theory, it is believed that the inert gas aids in preventing species from diffusing out of the EC stack during tempering and/or at least protects the EC stack from further oxidation that would be encountered with conventional tempering where the substrate would be exposed to the ambient.

Tempering of Electrochromic Devices Including Excess Lithium

In some embodiments, the damage to an electrochromic device during tempering results, at least in part, from the loss of lithium ions or other mobile charge carriers during exposure to high temperatures. It is believed that the lithium may be lost to the ambient by evaporation or oxidation of lithium at the outer edges of the electrochromic device, i.e., an edge which is exposed to the ambient. Alternatively, or in addition, some of the lithium may be lost by diffusion into the glass pane on which the electrochromic device is fabricated. Still further, some of the lithium which may actually remain within the electrochromic device stack during tempering may be lost by conversion of the lithium ions to lithium oxide or other compounds that effectively binds to and renders the otherwise mobile lithium ions immobile.

To address any one or more of these various sources of lithium loss, an electrochromic device may be fabricated with excess lithium formed in or on the device. In some embodiments, a layer of metallic lithium is fabricated within the device at a particular interface between layers of the stack. Thus, for example, a layer of metallic lithium may be formed between a transparent conducting oxide electrode and either the electrochromic layer or the counter electrode layer. Alternatively, a layer of metallic lithium may be formed between the counter electrode layer and the electrochromic layer or between an ion conducting layer and one or both of the electrochromic layer and a counter electrode layer. Alternatively, the excess lithium may be provided as a metallic layer on an outer edge of the electrochromic device prior to tempering. In other embodiments, the excess lithium is provided as excess lithium ions in a particular layer or in multiple layers of the electrochromic stack. In certain specific embodiments, the excess lithium is provided in one or both of the electrochromic layer and a counter electrode layer. In such layers, the excess lithium may result in a superstoichiometric lithium containing composition.

Generally, excess lithium provided in one or more regions of an EC device prior to tempering may be used to compensate for loss and/or conversion of lithium to a non-mobile form during tempering. However, some lithium may be converted to a non-mobile form during tempering, by design. For example, as described in U.S. patent application Ser. No. 12/772,055, filed Apr. 30, 2010, U.S. patent application Ser. No. 12/772,075, filed Apr. 30, 2010, and U.S. patent application Ser. No. 13/166,537, filed Jun. 22, 2011, all of which are herein incorporated by reference, in certain embodiments, a superstoichiometric region or layer is formed in the EC device construct. Lithium interaction with this superstoichiometric region, for example, during heating of the device during fabrication, can create an interfacial region that serves the function of an IC layer. Without wishing to be bound by theory, it is believed that at least some of the free lithium is converted to one or more immobile lithium compounds that serve as part of a matrix of the aforementioned interfacial region which serves the function of a conventional IC layer, i.e., it is electronically insulating but ionically conductive. Other portions of the lithium remain as mobile lithium ions that are active in the functioning EC device in the conventional sense, i.e., by transporting across the device during switching, when an electrical charge is applied to the electrodes of the device. Due to the higher temperatures encountered by the device during tempering, additional lithium may be strategically placed in the device in order to compensate for increased diffusion and or evaporation of lithium, including allowing sufficient lithium to remain in the device in a mobile form and lithium needed to form the aforementioned interfacial region.

The amount of excess lithium provided to the electrochromic device prior to tempering depends, in part, on the amount of lithium expected to be lost during the tempering process. In some cases, the amount of excess lithium is chosen to exactly compensate for the amount of lithium that is lost, as determined by empirical measurements or calculation. In a specific embodiment, the amount of excess lithium is between about 10% and 500% of the amount of lithium required for a (normally) functioning electrochromic device. That is, at least the amount of lithium required to satisfy the stoichiometry of the material layer that is the limiting factor (lowest molar amount as compared to the other material layers that switch using lithium intercalation/deintercalation) for amount of lithium needed to function. In additional embodiments, the amount of excess lithium is between about 25% and 250% in excess of the amount nominally required to operate the device, and in other embodiments, the amount of excess lithium is between about 50% and 100% in excess of the amount nominally required. It should be understood that the amount of lithium required for a properly functioning electrochromic device needs to account for the "blind charge" encountered in normal electrochromic devices. Some discussion of blind charge and the amount of lithium required for normally functioning devices is found in U.S. patent application Ser. Nos. 12/645,111 and 12/645,159, which were previously incorporated by reference.

Methods for Controlling the Location of Lithium in Electrochromic Devices Prior to Thermal Tempering In certain embodiments, the electrochromic device fabrication conditions are modified, or a post fabrication step is performed, to direct some or all of the lithium ions within the electrochromic device to a particular location within that device prior to tempering. For example, it may be desirable to drive some or all of the lithium ions into the counter electrode layer prior to tempering. In certain embodiments, this additional processing to position the lithium ions is performed at a point in the overall fabrication process after which the second of the electrochromic and counter electrode layers is deposited. In one embodiment, the additional processing is performed immediately after the second of these layers is deposited. In other embodiments, for example, the additional processing is performed upon removal of the fully fabricated electrochromic device from the fabrication apparatus. For example, the additional operation may be performed after the second transparent conducting oxide electrode is deposited and/or after a capping layer, if any, is formed on the electrode layer.

Various techniques may be employed to direct the lithium ions into a particular location in the device stack. For example, selective heating of one the faces of the electrochromic device may drive lithium to a desired location within the stack. In a specific embodiment, approximately 100% of the mobile lithium ions in the device are driven into the counter electrode layer prior to tempering.

It should be borne in mind that localizing lithium ions at a desired location may be accomplished, at least in part, by controlling the composition of the various layers in the stack as they are deposited. For example, a nickel tungsten oxide counter electrode layer may be deposited with a greatly enriched concentration of lithium. The electrochromic layer could be deposited without any lithium added. In some embodiments, the lithium rich counter electrode layer is deposited after the electrochromic layer in order to minimize the diffusion of lithium out of the counter electrode layer during the later stages of the device fabrication process.

It should also be understood that the location of the lithium ions may be chosen to provide a sufficient distance between the ions and a surface where they may be lost. Therefore, it may be desirable to have the lithium ions located as far away from the loss surface as possible, so that the diffusion path is sufficiently great that the lithium may not be lost in significant quantity during tempering. For example, if most or all of lithium would be lost through the outer exposed surface of the stack, then it is desirable to have the lithium located, to the extent possible, at the position in the stack that is furthest removed from the outer exposed surface. In contrast, if most of the lithium is lost into the glass during tempering, then prior to tempering, then lithium is positioned as close to the outer surface of the device as possible in order to provide a long diffusion path to the glass interface. In some embodiments, when it is known that lithium is lost through both major surface areas (faces) of the electrochromic device, one may drive the lithium into the interior or central region of the electrochromic device. For example, in one embodiment the lithium is concentrated in a central region between the electrochromic layer and the counter electrode layer. In one embodiment, the electrochromic layer includes a superstoichiometric oxygenated portion. As the electrochromic device is heated during tempering, the lithium diffuses throughout the device, and a portion of the lithium interacts with the superstoichiometric region and forms an interfacial region, which serves the function of an IC layer. Sufficient lithium may be deposited in the central region to serve this purpose, as well as to account for blind charge, mobile lithium required for switching the device, as well as loss of lithium from the device during tempering.

Methods for Controlling the Activity of Lithium in Electrochromic Devices during Thermal Tempering In some embodiments, damage to a fabricated electrochromic device from tempering can be mitigated or eliminated by controlling the chemical activity of the lithium in the device structure. One mechanism for reducing the chemical activity of lithium is by reducing the driving force for mass transport, particularly diffusion, of lithium in the high temperatures experienced during tempering. Because diffusion of a mobile species such as lithium ions is driven by the size of the lithium concentration gradient (or more precisely the lithium ion activity gradient) within any particular layer or across layers (or regions) in the electrochromic device structure, one method of reducing lithium ion activity is by engineering the activity gradients of lithium ions within the device. With a reduction in the driving force for lithium ions to reach an outer edge of the electrochromic device (whether the exposed outer surface of the device or the interface with the glass pane at the inner side of the device), one confines the lithium to the stack and thereby reduces the lithium lost during tempering.

In one embodiment, a relatively high concentration of lithium is provided on the outer exposed surface of the electrochromic device prior to tempering. Thus, the device will effectively have a lithium concentration gradient that naturally drives lithium ions toward the device interior and away from its exposed surface during the high temperatures encountered with tempering. In this embodiment, some of the lithium on the outer surface is sacrificial, while some of the lithium is not. As the lithium on the outer surface is exposed to heat during tempering, some of the lithium evaporates while some diffuses into the device structure. The amount of lithium on the outer surface may be an excess amount, as described herein. Alternatively, the higher concentration of lithium may reside at the innermost face of the device, i.e., the side of the device that contacts the glass layer. This will present a concentration gradient that drives lithium away from the glass-device interface and toward the stack interior. In yet another approach, relatively high concentrations of lithium are provided on both edges of the device so that all lithium diffusion is naturally driven toward the device interior and away from the edge regions where it might otherwise be lost to the environment. Higher concentrations of lithium provided in this embodiment may be made available through deposition metallic lithium and/or a lithium compound (for example, lithium carbonate, lithium oxide, lithium silicate, lithium tungstate, lithium niobate) and may include relatively high concentrations of lithium ions within the device layers as well.

In some embodiments, a lithium diffusion barrier is inserted at or near a surface where the lithium ions might be lost. Such diffusion barrier effectively blocks the transport of lithium ions to an edge of the device where they might otherwise be lost during tempering. A lithium diffusion barrier may be used in conjunction with one or more of the other techniques described herein. For example, a lithium diffusion barrier at the glass-device interface, on the exposed surface of the device, or both, may be employed to inhibit lithium loss from the device during tempering.

It should be understood that localizing some or all of the lithium ions at a particular position within the electrochromic device (to control the activity gradient) may be accomplished by various techniques. As mentioned, the lithium may be deposited at these locations during fabrication of the device, by sputtering metallic lithium onto the device, or by depositing a particular material that is part of the device structure, where the material is particularly rich in lithium. Alternatively, the lithium may be driven to one side or the other of the stack by application of asymmetric heating, as described above.

With this in mind, the additional lithium needed to force diffusion in a direction away from a loss surface may involve depositing islands of metallic lithium onto a device surface, such as onto a transparent conducting oxide electrode surface on the outer surface of the device.

In certain embodiments, a lithium "source" compound is provided at or near the outer or inner surface of the electrochromic device. Upon heating during tempering, the source material releases lithium ions which increases the local concentration of lithium and aids in preventing lithium within the device from diffusing toward the location of the source compound. Thus, loss of lithium by diffusion and ultimately release into the glass or ambient is avoided during tempering. Examples of suitable lithium source materials include lithium carbonate, lithium oxide, lithium silicate, lithium tungstate, and the like. In a specific embodiment, the lithium source material is applied only on the outer surface of the device, i.e., the surface of the device exposed to the ambient.

In certain embodiments, this lithium source material is integrated into a layer or region that would otherwise be applied to the electrochromic device. For example, capping layers may be applied to provide particular optical properties (for example, an antireflective layer), to increase the durability of the device, and/or provide a hermetic seal to the device. The lithium source compound may be incorporated in the capping layer and may be activated during tempering, producing lithium ions. This results in a local concentration gradient which promotes lithium diffusion away from the surface (where it might otherwise be lost) and into the interior regions of the device.

In yet another approach, a source of lithium may be provided in an encapsulated format, effectively serving as a reservoir of lithium that is available to control the lithium activity gradient during tempering. In a specific embodiment, the lithium source, which may be lithium metal or a lithium compound, is provided in a core-shell morphology within the electrochromic stack. The lithium within this shell or other encapsulating medium is released, in one embodiment, by application of heat during the tempering process. Examples of materials that may be suitable as an encapsulating shell for a core of metallic lithium include lithium carbonate, lithium oxide, lithium silicate, lithium tungstate, lithium niobate, and the like. In another example, lithium metal or ions are encapsulated by carbon-containing microspheres, fullerenes, and/or nanotubes, for example, all-carbon or hetero carbon/non-carbon structures (for example, carbon-silicon heterofullerenes containing lithium ions). For example, during tempering, the lithium (metallic or ionic) may be released while the carbon structures are burned away. In one embodiment, lithium encapsulating silicon cage clusters are used as an encapsulated form of lithium metal or lithium ions. Metal oxides may also be used as encapsulation materials for lithium metal and/or ions. In certain embodiments, a lithium alloy and/or a lithium intermetallic is used as a source of lithium during tempering. For example, a lithium aluminum alloy or a lithium silicon alloy may be deposited in one or more regions of the EC device as described herein. During tempering, the alloy releases lithium to the device. For example, lithium silicon alloys may contain about 70 atomic percent or more of lithium. When heated to high temperatures during tempering, the lithium silicon alloy may be used as a material for controlled release of lithium into the EC device.

In yet other embodiments, the lithium activity gradient is controlled by providing lithium metal in the vapor phase in the tempering chamber. At sufficiently high partial pressures, the driving force for evaporation or oxidation of lithium from the stack may be reduced.

Electrochromic Device Structures for Tempering

It has been found that the high temperatures associated with tempering glass result in the materials of different layers in an EC device having a larger grain size. In one embodiment, the grain size of one or more of the layers (or regions) of the EC device is smaller than it would typically be in the final EC device. By starting with materials in one or more layers having a smaller grain size, the heat associated with tempering is used to aid in transforming the one or more layers having the smaller grain size into a form desired in the final EC device, rather than the tempering process transforming already appropriately sized crystallites to unacceptable crystalline forms in the one or more layers. In one embodiment, one or more layers of the EC stack are formed in an amorphous or substantially amorphous morphology prior to tempering.

In certain embodiments, smaller grain sizes and/or an amorphous state of the one or more layers is achieved by deposition of a layer using a lower substrate temperature during deposition, and/or lower density and/or lower energy plasma during deposition. In this way, lower density material layers and/or more amorphous layers are formed.

In certain embodiments, one or more layers of the EC stack include a material that is less sensitive morphologically to the heat of tempering. In one embodiment, one or more layers of the EC stack includes a material that is crystalline, where the material substantially maintains its morphology when exposed to the heat of tempering. In one embodiment, the material that is crystalline substantially maintains its electrochromic stack functionality before and after tempering.

In certain embodiments, one or more layers of the EC stack include a first phase material and a second phase material that leads to pinning of grain boundaries in the layer. Grain boundary pinning works by the phenomenon that when a grain boundary of the first phase material intersects with a particle of the second phase material, a certain amount of grain boundary area of the first material is removed from the system. In order for the grain boundary to move off the particle, the grain boundary area that was removed must be restored and this restoration of grain boundary area requires additional energy. Thus, grain boundary pinning may be used to substantially maintain grain size and morphology during the tempering process. Grain boundary pinning may be used to effectively set an upper limit to grain size growth during the tempering process. In one embodiment, there is also a third phase material which aids in grain boundary pinning.

In one embodiment, the second phase material is present in a lower quantity than the first phase material, for example, the first phase material is doped with the second phase material. In one embodiment, the first phase material is tungsten oxide and the second phase material is silicon oxide dispersed in a matrix of the tungsten oxide. In one embodiment the first phase material is between about 95% and about 99% tungsten oxide and the second phase material is between about 1% and about 5% silicon oxide.

One potential source of damage to electrochromic devices during tempering results from inter-layer stresses created by volumetric changes during the tempering process. These changes result from differing coefficients of thermal expansion (CTE) among the materials used in the layers of the device. This source of degradation may be addressed by engineering the device so that the coefficients of thermal expansion are matched among the various layers in the device. It is believed, for example, that the coefficient of thermal expansion for nickel tungsten oxide (commonly used in counter electrode layers) is typically quite different from those of the transparent conductive oxides commonly used as the device electrodes. Such transparent conductive oxides conventionally include indium tin oxide or TEC.

In one embodiment, the coefficients of thermal expansion of the materials used in the electrochromic device are engineered to match one another by modifying their respective morphologies, compositions, etc. In one embodiment, the CTE's of adjoining layers are substantially similar. In one embodiment, the CTE of any two adjoining material layers does not vary by more than about 5%, in another embodiment the CTE of any two adjoining material layers does not vary by more than about 15%, and in another embodiment the CTE of any two adjoining material layers does not vary by more than about 25%. For example, an EC device may have a tungsten oxide (cathodic electrochromic material) layer on a transparent conducting layer, and a ceramic electrolyte layer on the tungsten oxide layer. One, two, or all three of the layers may be modified (e.g. doped, sputtered to achieve a particular density/crystal packing/amorphicity, etc.) so that the CTE's are substantially similar. One of ordinary skill in the art would recognize that CTE's may be positive or negative, e.g., tungsten oxide has a positive CTE at temperatures up to 700° C., but at higher temperatures has a negative CTE. Tungsten oxide can be doped with zirconium oxide to reduce the CTE to near zero or even have a negative CTE at tempering temperatures. In one embodiment, the tungsten oxide layer's CTE is adjusted to be substantially similar to the adjoining material layers, where the adjoining layers' CTE's are optionally adjusted. The CTE of the tungsten oxide layer in the device is substantially similar to the adjoining layers, e.g., the transparent conducting layer and the tungsten oxide layer's CTE's vary by 25% or less, while at the same time the ceramic electrolyte layer and the tungsten oxide layer's CTE's vary by 15% or less. The individual layers may have positive, negative, or zero CTE's while still adhering to the variance described.

In other embodiments, the presence of distinct layers in the EC device is minimized. For example, rather than having distinct material layers, one or more graded regions exist in the EC device. In one embodiment, the entire device structure is graded, i.e., an EC element is fabricated on a non-tempered glass substrate. The desired EC lites are cut from the substrate and subsequently tempered. Since there are no distinct boundaries between layers, the EC element is may be less prone to damage during tempering. For example, a graded region with a gradual transition from one material to another may be less prone to damage due to differences in the coefficients of thermal expansion of the two materials. As another example, a graded region with a gradual transition from one material to another may be less prone to damage due the diffusion of species (e.g., oxygen or lithium) between the materials.

Chemical Strengthing Methods

In certain embodiments, chemical strengthening is used in lieu of tempering to strengthen the glass substrate. For example, ions such as $Na^+$ or $K^+$ may be diffused into the surface of the glass substrate in order to create a high stress skin layer which places the external glass surface into compression, thereby increasing glass strength. In one embodiment, chemical strengthening is used post EC device formation. In one embodiment, the EC device is designed to allow for motion of the ions required for chemical strengthening through the EC device without substantially changing the structure, composition, or distribution of other ions (for example, $Li^+$) present in the EC device, or in certain embodiments, the lithium or other ions are replaced in the EC device after the chemical strengthening.

For example, in some embodiments, lithium or sodium aluminosilicate glass is used as a substrate for EC device fabrication. The EC device is configured to function using lithium ion intercalation/deintercalation. The lithium may be added to the device during fabrication or not. After device fabrication, the glass is heated in a salt bath, e.g., molten potassium nitrate (melting point 334° C.), containing a high concentration of potassium ions relative to the lithium or sodium ions in the glass. Ion exchange takes place, with lithium or sodium ions in the glass exchanging with potassium ions, that strengthens the glass in a similar fashion to tempering, because the exchange only occurs in an outer region of the glass. This creates a compression and tension zone much like tempered glass, but not as strong. In the event the EC device loses its lithium ions during the ion exchange, the lithium ions are replaced selectively to the EC device, leaving the glass in a strengthened form. In the event the lithium ions were not added to the device prior to chemical strengthening, ion exchange is selectively used to replace any potassium ions in the device with lithium ions. For example, the top surface of the EC coating is treated with an excess of lithium ions. The ensuing ion exchange replaces potassium in the device with lithium. The device may be washed to remove excess potassium nitrate and be further heated to remove any moisture.

In one embodiment, a layer having a high concentration of the species required for chemical strengthening (for example, $Na^+$ or $K^+$) is deposited at the glass/EC stack interface. In one example, potassium nitrate is deposited as a film on the glass. The film may be spray coated or dipped, and then dried to remove moisture. In this embodiment, the bottom layer (e.g., a TCO layer or diffusion barrier) of the EC stack is made of a material that minimizes diffusion of the chemical strengthening species through it, and thus forms a barrier layer to the chemical strengthening species. The remainder of the EC device is fabricated thereon, which, e.g., is a device as described herein, including lithium. The glass is then subjected to heating, e.g., between about 300°

C. and about 400° C., and in one embodiment between about 350° C. and about 375° C. During heating, the potassium ions will preferentially diffuse into the glass allowing for chemical strengthening of the glass substrate with minimal impact to the EC device on top of the substrate. It is known that EC devices will not detrimentally lose lithium at the temperatures described for these embodiments. In certain embodiments, the EC device is lithiated after the heating process.

FIGS. 5A and 5B show tables summarizing some of the different embodiments disclosed herein.

Although the foregoing disclosed embodiments have been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A method of fabricating an electrochromic device on a glass substrate having a first transparent conducting oxide layer disposed thereon, the method comprising:
   a) forming a stack on the first transparent conducting oxide layer, the stack comprising:
      (i) an electrochromic layer comprising an electrochromic material; and
      (ii) a counter electrode layer comprising a counter electrode material;
   b) forming a second transparent conducting oxide layer on top of the stack;
   c) forming a capping layer on top of the second transparent conducting oxide layer, wherein the capping layer includes an oxygen diffusion barrier configured to reduce oxygen diffusion into, and out of, the stack during tempering; and then
   d) tempering the glass substrate after operation c).

2. The method of claim 1, further comprising introducing lithium to the stack in excess of that required for the electrochromic device to operate in transitioning between optical states.

3. The method of claim 2, wherein the lithium is introduced to the stack prior to c).

4. The method of claim 1, further comprising forming a diffusion barrier on the glass substrate prior to a).

5. The method of claim 4, wherein the diffusion barrier is a lithium diffusion barrier and/or a sodium diffusion barrier.

6. The method of claim 1, wherein tempering the glass substrate is performed in an inert atmosphere.

7. The method of claim 1, wherein the capping layer includes a material selected from the group consisting of silicon dioxide, silicon aluminum oxide, silicon nitride, and silicon oxynitride.

8. The method of claim 1,
   wherein forming the stack comprises forming the electrochromic layer and/or the counter electrode layer having a first morphology, and
   wherein tempering the glass substrate transforms the first morphology of the electrochromic layer and/or the counter electrode layer.

9. The method of claim 1, wherein the electrochromic material, the counter electrode material, the first transparent conducting oxide layer, and the second transparent conducting oxide layer have substantially similar coefficients of thermal expansion.

10. The method of claim 1, wherein the capping layer is a sacrificial layer that is removed after tempering the glass substrate.

11. The method of claim 10, wherein the sacrificial layer is opaque.

12. The method of claim 1, wherein the capping layer comprises a material selected from the group consisting of silicon, titanium, and aluminum.

13. The method of claim 1, wherein the capping layer comprises at least one of a lithium metal material, a lithium alloy material, and a lithium intermetallic material.

14. The method of claim 13, wherein tempering the glass substrate drives lithium from the capping layer into the stack.

15. The method of claim 10, wherein the capping layer is removed using a process selected from the group consisting of a chemical etching process with hydrofluoric acid, a plasma etching process, an ion milling process, a laser ablation process, an exposure to radiation process, and an applying shear forces process.

16. The method of claim 13, wherein the capping layer is further configured to prevent lithium from leaving the stack while tempering the glass substrate.

17. The method of claim 1, wherein the capping layer is configured to seal the electrochromic device hermetically.

18. The method of claim 1, wherein the capping layer comprises a protective oxide or nitride layer.

19. The method of claim 1, wherein the capping layer is substantially transparent.

20. The method of claim 1, wherein the capping layer comprises a low-emissivity material.

21. The method of claim 1, wherein the capping layer comprises an anti-reflective material.

\* \* \* \* \*